United States Patent [19]

Sakaue et al.

[11] 4,162,411
[45] Jul. 24, 1979

[54] CHARGE TRANSFER ANALOG PROCESSING APPARATUS FOR SERIAL-TO-PARALLEL CONVERSION

[75] Inventors: Tatsuo Sakaue, Yokohama; Mineo Iwasawa, Kanagawa, both of Japan

[73] Assignee: Tokyo Shibaura Electric Co., Ltd., Kawasaki, Japan

[21] Appl. No.: 803,402

[22] Filed: Jun. 3, 1977

[30] Foreign Application Priority Data

Jun. 3, 1976 [JP] Japan ................................. 51-64104

[51] Int. Cl.² ...................... G11C 19/28; H01L 29/78; H03H 7/28
[52] U.S. Cl. ................................ 307/221 D; 357/24; 333/165
[58] Field of Search .................... 357/24; 307/221 D; 333/70 T

[56] References Cited

U.S. PATENT DOCUMENTS

| | | | |
|---|---|---|---|
| 3,763,480 | 10/1973 | Weimer | 357/24 |
| 3,801,883 | 4/1974 | Tiemann | 357/24 |
| 3,876,952 | 4/1975 | Weimer | 357/24 |
| 3,937,985 | 2/1976 | Cooper | 357/14 |
| 3,946,247 | 3/1976 | Collins et al. | 357/24 |
| 3,969,634 | 7/1976 | Su et al. | 357/24 |

*Primary Examiner*—William D. Larkins
*Assistant Examiner*—Gene M. Munson
*Attorney, Agent, or Firm*—Oblon, Fisher, Spivak, McClelland & Maier

[57] ABSTRACT

An analog signal processing apparatus of series write-in and parallel read-out type includes a charge transfer device with a plurality of stages and for transferring sampled analog signal charge packets in response to transfer pulses applied. After stoppage of transfer pulses supply, a signal charge packet is shifted to a storage region provided adjacent to a signal charge storage site at each stage. The signal charge packet is kept in the storage region until an analog input signal is rewritten into the device. A signal charge read-out device is coupled with the storage region. The amount of signal charge stored in the storage region increases with time during the charge storage period of time due to generation of dark current charge. Means for removing dark current charge is provided.

4 Claims, 10 Drawing Figures

FIG. 3
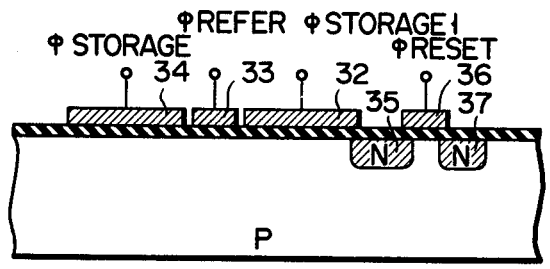
FIG. 4A  t₁
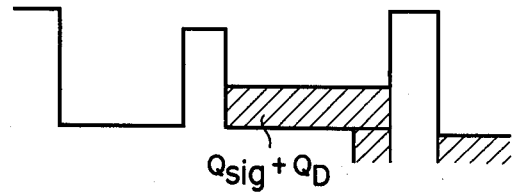
FIG. 4B  t₂
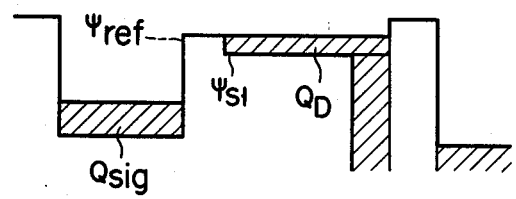
FIG. 4C  t₃
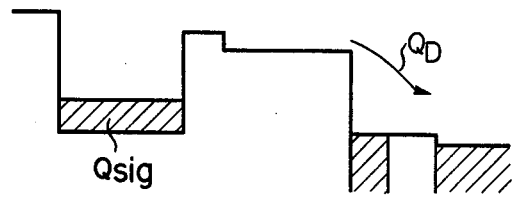
FIG. 4D  t₄
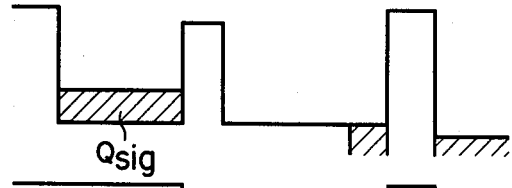
FIG. 4E  t₅
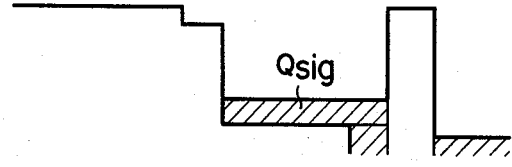

CHARGE TRANSFER ANALOG PROCESSING APPARATUS FOR SERIAL-TO-PARALLEL CONVERSION

BACKGROUND OF THE INVENTION

The present invention relates to a charge transfer type analog signal processing apparatus permitting series write-in and parallel read-out of analog signals.

Recently, it has been seen energetic development of charge transfer devices such as CCD (charge-coupled device) and BBD (bucket brigade device). The charge transfer devices can store an analog quantity temporarily. An analog signal is sampled and the amount of charge is produced which is proportional to the analog sample. The charge packets are shifted along the charge transfer device in response to transfer pulses. After the transfer, if potential with the storage level is applied to only the transfer electrodes at the signal charge storage sites, the signal charge packets are stored in the storage sites. Dark current charge due to thermal excitation carriers produced in the semiconductor is added to the signal charge packet stored in the storage site thereby to distort the signal. The amount of dark current charge depends on defects of a semiconductor substrate and the manufacturing process of the device. In the worst case, the amount of the dark current charge after 100 ms of storage time sometimes reaches about ⅓ of the maximum storable amount of signal charge in the storage site. Under this condition, it is impossible to store the signal charge for a long time.

The analog signal processing apparatus using the charge transfer device has found various uses. A transversal filter is enumerated for one of them. An analog signal processing apparatus for making the weighting signals for the transversal filter from an analog signal, for example, if desired for in which the analog signal is periodically written into the signal procesing apparatus and analog signal charge packets are read-out from charge storage sites in parallel fashion and then the signal charge packets read-out from one storage site are integrated.

SUMMARY OF THE INVENTION

Accordingly, an object of the present invention is to provide a charge transfer analog signal processing apparatus permitting series write-in and parallel read-out of an analog signal.

Another object of the present invention is to provide a charge transfer analog signal processing apparatus of series write-in and parallel read-out type which is provided with dark current removal means and capable of storing signal charge packets for a long time.

An analog signal processing apparatus for series write-in and parallel read-out of analog signals according to the invention includes a charge transfer device with a plurality of stages and a plurality of read-out means disposed adjacent to a given signal charge storage site at each stage. Transfer pulses are periodically applied to the charge transfer device. Upon receipt of the transfer pulses, the device samples an analog input signal and the sampled analog signal charge packets are shifted along the device. At the end of the write-in of the analog signal, the analoq signal charge packets in the respective storage sites are transferred to corresponding first storage regions where the packets are stored for a given period of time. The first storage regions are coupled with charge read-out means.

The charge quantity in the first storage regions increases with time during the charge storage period due to generation of dark current charge.

The analog signal processing apparatus of the invention is provided with second storage regions for receiving only analog signal charge packets from the first storage regions and disposed adjacent to the first storage regions and with removal means for removing dark current charge when the first storage regions store only dark current charge and disposed adjacent to the first storage regions. After removal of the dark current charge components, signal charge components in the second storage regions are transferred to the first storage regions where they are stored.

Other objects and features of the invention will be apparent from the following description of the accompanying drawings, in which:

BRIEF DESCRIPTION OF THE DRAWING

FIG. 3 is a cross sectional view of the FIG. 1 apparatus taken along line X–O–Y;

FIGS. 4A to 4E illustrate surface potentials for explaining the operation of dark current charge removal in the FIG. 1 apparatus;

DETAILED DESCRIPTION OF THE PREFERRED EMBODIMENT

Figure 1:
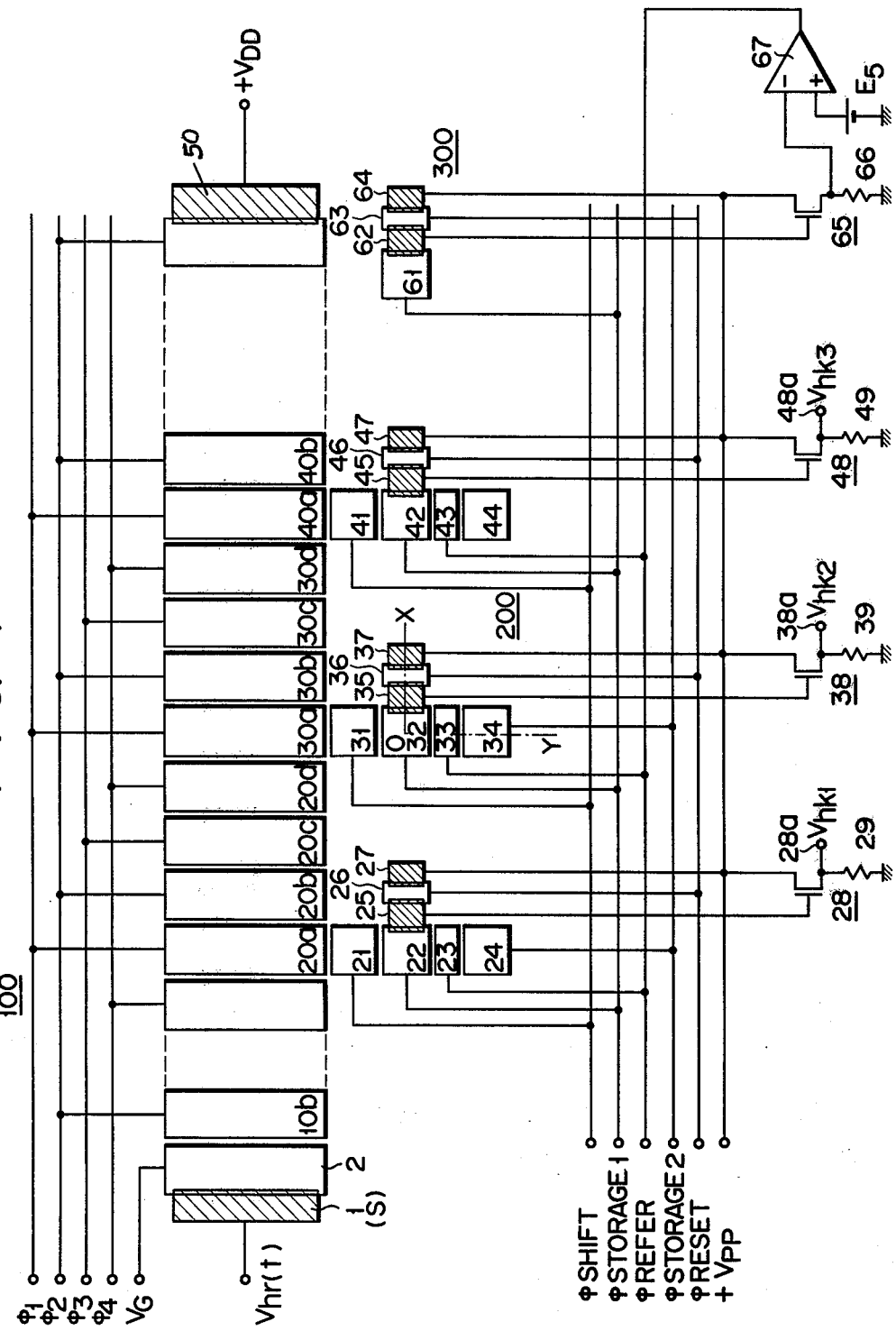
FIG. 1 shows a schematic diagram of an embodiment of a charge transfer type analog signal processing apparatus, particularly illustrating the electrode construction of the apparatus.

As shown in FIG. 1, an analog signal processing apparatus embodying the invention comprises a 4-phase drive type charge coupled device including a charge transfer portion 100 with a plurality of stages and a read-out portion 200 with dark current charge removal means for storing signal charge packets from respective stages and reading out the signal charge packets. As is well known, the charge transfer portion 100 is comprised of an n-type source region 1 formed in a p-type silicon substrate, for example, and coupled with an analog input signal $V_{hk}(t)$ source, an input gate electrode 2 formed on an insulating layer of, for example, $SiO_2$, on the semiconductor substrate, while overlapping partly with the source region, a plurality of transfer electrodes 10b, . . . 20a, 20b, 20c, 30a . . . disposed on the insulating layer, and an n-type drain region 50 coupled with a power source $+V_{DD}$. The input gate electrode 2 is connected to a bias source $V_G(+15 \text{ V})$. Corresponding transfer electrodes in the respective stages of the charge transfer portion 100 are connected commonly by a single line for receiving the same transfer clock signal. To be more precise, a clock signal $\phi_2$ is applied to the transfer electrodes 10b, 20b, and 30b, a clock signal $\phi_3$ to the transfer electrodes 10c, 20c, and 30c, a clock signal $\phi_4$ to the transfer electrodes 10d, 20d, and 30d, and a clock signal $\phi_1$ to the transfer electrodes 20a, 30a, and 40a.

The transfer electrodes 20a, 30a, and 40a serve as signal charge stoppage or storage sites at respective stages when the write-in of an analog signal into the charge transfer portion is completed. The read-out portion 200 for reading out the signal charge packets stored is provided adjacent to the transfer electrodes 20a, 30a, and 40a. The read-out portion 200 includes shift electrodes 21, 31 and 41 disposed adjacent to the $\phi_2$ transfer electrodes 20a, 30a and 40a, first storage electrodes 22, 32 and 42 adjacent to the shift electrodes, reference electrodes 23, 33 and 43 adjacent to the first storage electrodes, and reset electrodes 26, 36 and 46 adjacent to the first storage electrodes. First n-type regions are formed in the substrate so as to overlap with the first electrodes and the reset electrodes. The first n-type regions 25, 35 and 45 each form a floating junction together with the semiconductor substrate. Second n-type regions 27, 37 and 47 are embedded in the substrate, overlapping at one end with the reset electrodes 26, 36 and 46, as shown in the figure. These second n-type regions are connected to a power source $+V_{pp}$. Insulated gate field effect transistors 28, 38 and 48 are connected at the gate electrodes to the floating junction regions 25, 35 and 45, at the drains to the $+V_{pp}$ source, and at the source to resistive impedance elements 29, 39 and 49 of which other ends are grounded, respectively. As a matter of course, the field effect transistors are formed in the same substrate.

Figure 2:
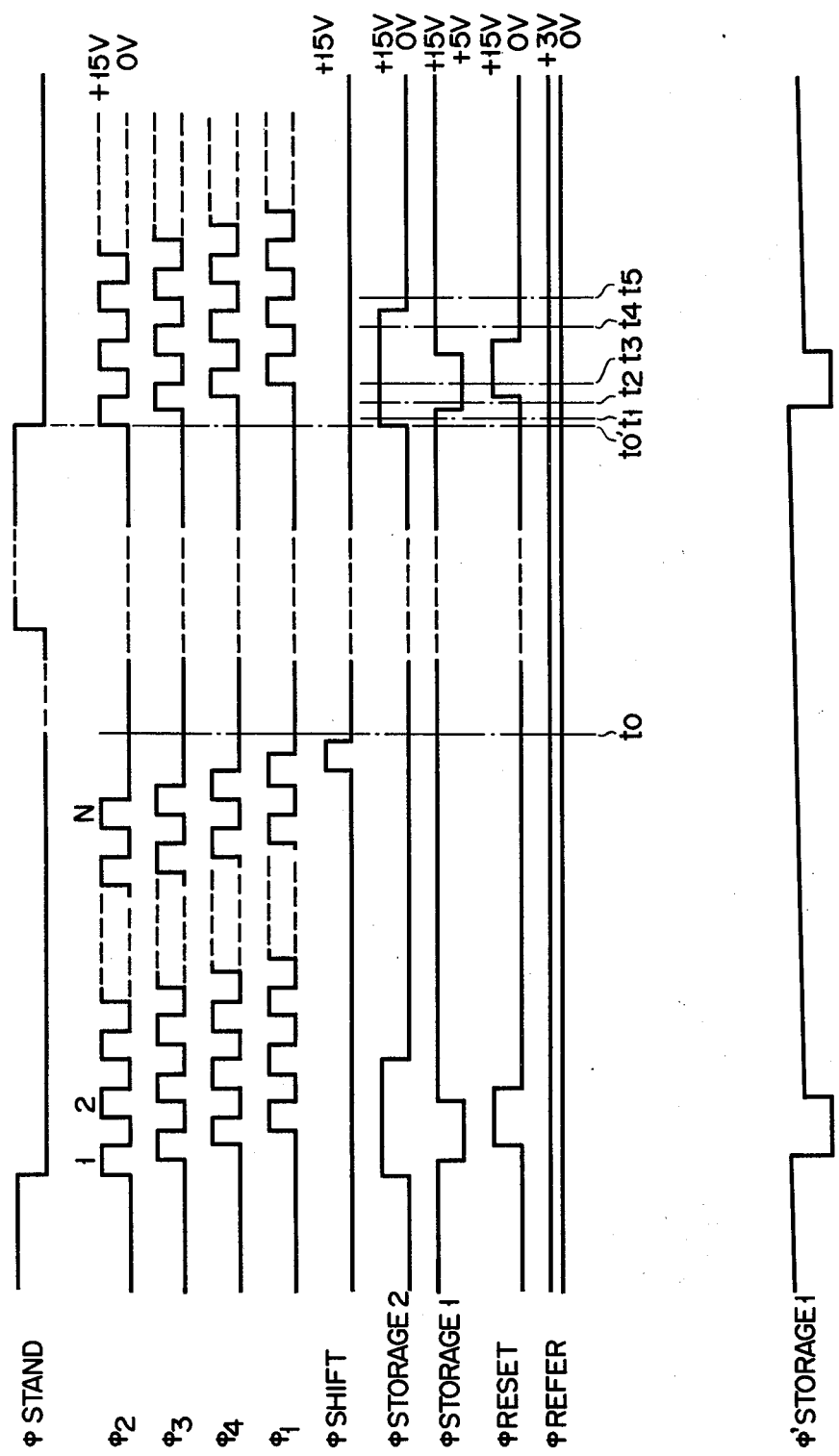
FIG. 2 shows a set of various drive pulses used in the apparatus shown in FIG. 1.

Shift pulse $\phi$ SHIFT, first storage pulse $\phi$ STORAGE 1, second storage pulse $\phi$ STORAGE 2, and reset pulse $\phi$ RESET, as shown in FIG. 2, are applied to shift electrodes 21, 31 and 41, and first storage electrodes 22, 32 and 42, second electrodes 24, 34 and 44 and reset electrode 26, 36, 46, respectively. Reference electrodes 23, 33 and 43 receive a reference voltage $\phi$ REFER which is higher than the low level of the shift pulse $\phi$ SHIFT and the second storage pulses $\phi$ STORAGE 2 but lower than the low level of the first storage pulse $\phi$ STORAGE 1.

The explanation to follow is the operation of the analog signal processing apparatus shown in FIG. 1. As shown in FIG. 2, transfer clocks $\phi_1$ to $\phi_4$ are overlapping clocks. At the negative transition of each reference pulse $\phi$ STAND, these transfer clocks are applied to the charge transfer portion 100, by the number thereof required for writing a time-variable analog signal into the charge transfer device. When the analog signal is written into the N stages of the charge transfer portion 100, the number of each transfer clock may be N, as shown.

The analog input signal $V_{hk}(t)$ is applied to the source 1 where it is converted an analog charge quantity $Q_{hk}(t)$. The analog charge is sampled and shifted along the transfer portion 100. At the end of the writing operation for a predetermined period of time, i.e. the application of the Nth clock $\phi_1$, the analog signal charge packets sampled are stored in the given storage sites at each stage, i.e. the potential wells under the $\phi_1$ electrodes 20a, 30a and 40a which are driven by the clock signal $\phi_1$. At the time that the analog signal charge packets sampled are transferred to the given storage sites, respectively, the shift pulse $\phi$ SHIFT is applied to the shift gate electrodes 21, 31 and 41. At this time, the first storage electrodes 22, 32 and 42 are sustain their levels at high or storage level (+15 V), and the second storage electrodes 24, 34 and 44 and the reset electrodes 26, 36 and 46 sustain their levels at low level (0 V). When the shift electrodes become high level, the analog signal charge packets stored in the respective storage sites are shifted to the first storage regions, or the potential wells under the corresponding first storage electrodes, respectively, and stored therein. That is, at time $t_0$ in the timing diagram of FIG. 2, the first storage regions under the first storage electrodes store the analog signal charge packets. The charge transfer portion 100 are ready for the rewrite-in of the analog signal. The storage charge packets under the first storage electrodes raise the potential at the floating junction regions 25, 35 and 45, i.e. the potentials at the gate electrodes of FET's. Since the FET's operate in source-follower mode, changes of the gate potential are detected as the voltage drops across load resistive elements 29, 39 and 49. Tapped outputs $V_{hk1}$, $V_{hk2}$, $V_{hk3}$ of the analog signal memory are taken out from the sources 28a, 38a and 48a of the FET's 28, 38 and 48.

The analog signal processing apparatus according to the present invention can be suitably used for writing a periodically incoming analog signal in serial mode and readout in parallel mode. An example of such is a vertical synchronizing pulse in the vertical blanking period of the composite video signal.

The signal charge packets stored in the potential wells under the first storage electrodes 22, 32 and 42 remain stored there until the analog signal is again written in and read out. For this, the charge quantity stored in the potential wells increases with time due to generation of dark current charge. During the storage period for the first storage electrodes, the second storage electrodes 24, 34 and 44 are kept non-storage level and hence no dark current charge is generated. At time $t_0'$ that the analog signal is rewritten into the charge transfer portion 100, the second storage pulse $\phi$ STORAGE 2 is pulsed to the high level or storage level (+15 V) to remove the dark current charge. At time $t_1$ that the first and second storage pulses $\phi$ STORAGE 1 and $\phi$ STORAGE 2 are high level (+15 V) and the reset pulses $\phi$ RESET are low level (0 V), the analog signal charge $Q_{sig}$ and the dark current charge $Q_D$ are both stored in the potential wells under the first storage electrodes 22, 32 and 42, as shown in FIG. 4A. At time $t_2$ that the first storage pulse $\phi$ STORAGE 1 are low level (+5 V), the surface potential of the semiconductor substrate under the first storage electrodes 22, 32 and 42 rises, as shown in FIG. 4B. As shown in FIG. 4B, the dark current charge $Q_D$ remains under the first storage electrodes and the signal charge $Q_{sig}$ passes through the potential barrier under the reference electrodes to the second storage regions under the second storage electrodes, provided that the following relation holds. That is, $$\psi REF - \psi_{S1} = Q_D / C_{S1}$$

where $\psi_{S1}$ is the semiconductor substrate surface potential under the first storage electrode, depending on the low level (+5 V) of the first storate pulse $\phi$ STORAGE 1, $\psi$ REF the surface potential under the reference electrode, depending on the reference voltage $\phi$ REF, and $C_{S1}$ capacitance under the first storage electrode, depending on the thickness of oxide film SiO$_2$ and the area of the first storage electrode. Under the just-mentioned condition, if the reset pulse $\phi$ RESET is made high level (+15 V), the dark current charge $Q_D$ flows into the drain regions 27, 37 and 47, as shown in FIG. 4C. At time $t_4$ that the reset pulse $\phi$ RESET is low level and the first and second storage pulses $\phi$ STOR- AGE 1 and φ STORAGE 2 are the high level, the signal charge packets $Q_{sig}$ are stored in the second storage regions under the second storage electrodes, as shown in FIG. 4D. Under this condition, if the storage pulse φ STORAGE 2 becomes the low level (0 V), the surface potential under the second electrodes rises above the surface potential under the reference electrodes and the signal charge packets $Q_{sig}$ are transferred into the potential wells under the first storage electrodes. In this manner, the dark current charge may be removed which are generated in the first storage regions under the first electrodes during the storage period of time.

The dark current charge quantity increases with time and thus if the voltage applied to the first storage electrodes rises with time during the storage period of time, as indicated by φ' STORAGE 1 in FIG. 2, most of signal distortion due to the dark current charge may be removed even during the storage period.

As described above, the removal of dark current charge is largely influenced by the reference voltage φ REF applied to the reference electrodes. In order to effectively remove dark current charge, it is desirable that the quantity of dark current charge occurring during a given period is detected and the reference voltage is so controlled as to be dependant on the that charge quantity.

Returning to FIG. 1, a dark current charge detector designated by reference numeral 300 includes a storage electrode 61 like the first storate electrodes 22, 32 and 42, a floating junction region 62 like the floating junction regions 25, 35 an 45, a reset electrode 63 like the reset electrodes 26, 36 and 46, and a drain region 64 like the drain regions 27, 37 and 47. The storage pulse φ STORAGE 1 is applied to the storage electrode 61 and the reset pulse φ RESET to the reset electrode 63. The drain region 64 is coupled with the power source $+V_{pp}$. The floating junction region 62 is coupled with the gate electrode of an FET 65. The FET 65 is coupled at the drain with the power source $+V_{pp}$ and at the source with the ground via a load resistive element 66 and also to the inverting input of the operational amplifier 67. The power source $E_s$ is connected to the noninverting input of the operational amplifier 67. The output signal of the operational amplifier 67 controls the reference voltage φ REF to be applied to the reference electrodes 22, 32 and 42. Dark current charge generates in the potential wells under the storage electrode 61, the quantity of which is equal to that of the dark current charge generated in the potential wells under the first storage electrodes 22, 32 and 42 during the storage period. The quantity of the dark current charge under the storage electrode 61 is detected as the voltage drop across the load resistive element 66. If this potential change is fed back to the reference voltage φ REF through, for example, the operational amplifier, the reference voltage may be automatically set at a proper value. Further, if the voltage across the load resistive element 66 is fed back to the first storage voltage φ STORAGE 1 during the storage period, the voltage φ STORAGE 1 may be increased with time. The dark current charge stored in the potential well under the storage electrode 61 is not discharged until the reset voltage is applied to the reset electrode 63 after the storage period.

With the analog signal processing apparatus of the invention, the storage regions under the first storage electrodes may receive new information every write-in of an analog signal, when the analog signal is written into the apparatus at a given time interval. This means that the analog signal processing apparatus of the invention has an integration function in addition to the memory function.

While the embodiment thus far described used a charge coupled device for the charge transfer portion, a bucket bridge transfer device may also be used. A three-phase, two-phase or single-phase driving method may be used for driving the charge transfer device. The well-known floating gate structure for analog sample read-out may be employed as a substitute for the floating junction structure used in the above-mentioned embodiment.

Figure 5:
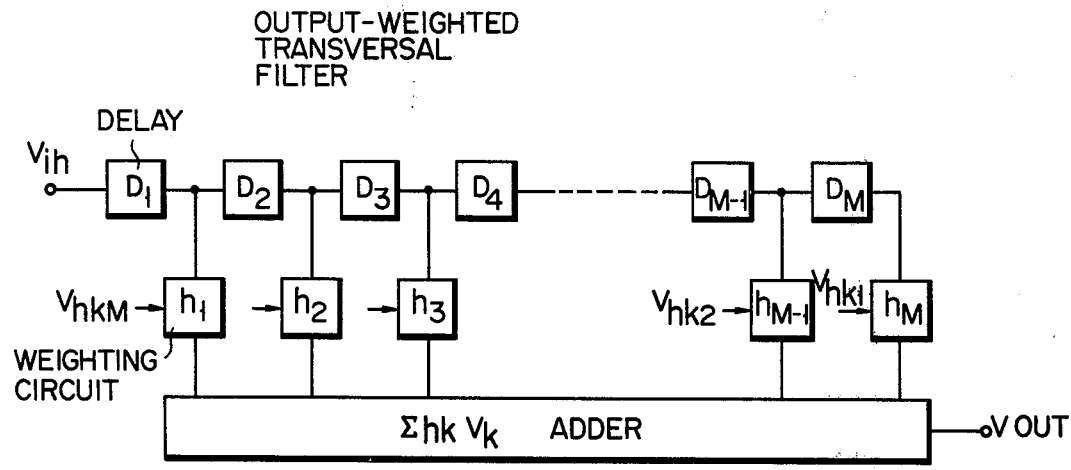
FIG. 5 shows a block diagram of an output-weighted transversal filter which may be used in combination with the analog signal processing apparatus of the invention.
Figure 6:
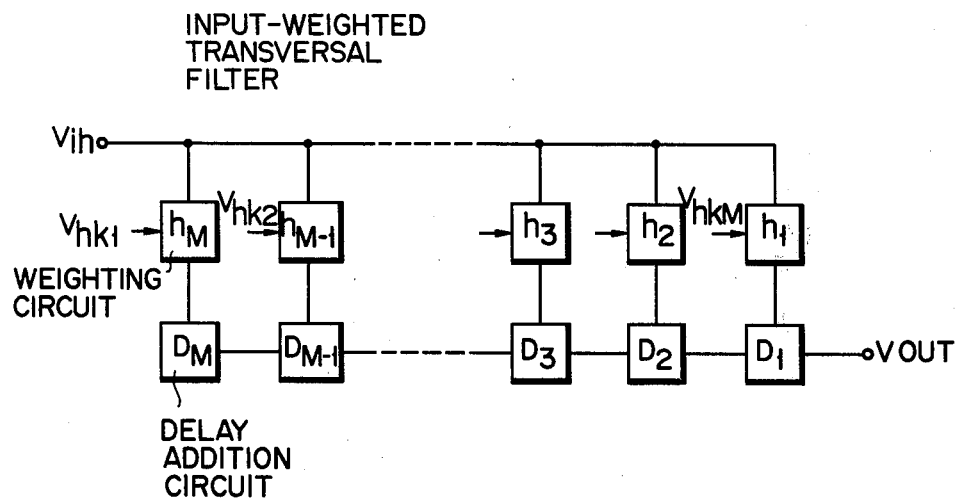
FIG. 6 shows a block diagram of an input-weighted transversal filter which may also be used in combination with the apparatus.

The output signals of the analog signal processing apparatus of the invention may be used as weighting voltages of the output-weighted transversal filter as shown in FIG. 5 including a delay network $D_1$ to $D_M$, weighting circuits $h_1$ to $h_M$ coupled with the tapped outputs of the delay network, and an adder circuit ADD coupled with the weighting circuits $h_1$ to $h_M$. In this case, the output-weighted transversal filter may be replaced by an input-weighted transversal filter disclosed in the copending application assigned to the same assignee as the present application and filed on April 29, 1976, bearing Ser. No. 681,700. The input-weighted transversal filter includes the weighting circuits $h_l$ to $h_M$ receiving an input signal and delay-addition circuits $D_1$ to $D_M$ coupled with the weighting circuits $h_1$ to $h_M$. The charge transfer transversal filter and the analog signal processing apparatus of the invention may be both integrated into a single semiconductor chip.

As mentioned above, the analog signal processing apparatus of the invention has the integration function as well as the memory function. Therefore, when it is used as a weighting signal generating means of the transversal filter, it is unnecessary to generate given weighting voltages by only one writing operation of the analog information signal. In other words, the weighting signal generating means may be constructed such that the writing operations of several tens produce the given weighting voltages. With such a construction, the influence of random noises included in the analog signal is reduced, improving S/N ratio of the weighting voltage.

What is claimed as new and desired to be secured by Letters Patent of the United States is:

1. A charge transfer analog signal processing apparatus for serial-to-parallel conversion, comprising:
   a charge transfer device with a plurality of stages for shifting analog signal charge packets sampled in one direction;
   transfer pulse supply means for supplying transfer pulses for a predetermined period of time to said charge transfer device and for shifting the signal charge packets along said charge transfer device;
   pairs of first and second storage means each pair of which is coupled with said each stage of said charge transfer device, said first storage means being coupled with said corresponding and receiving the signal charge packets stored in said corresponding stages and storing the same therein, said first storage means then storing an amount of charge which subsequently increases with time during a storage period due to dark current charge, said second storage means coupled with said first storage means and receiving only the signal charge packets from said first storage means and storing the same which in turn are transferred to said first storage means after the dark current charge is exhausted from said first storage means;

means coupled with said first storage means for exhausting the dark current charge from said first storage means when said first storage means store only the dark current charge;

read-out means coupled with said first storage means for reading out the signal charge stored in said first storage means.

2. A charge transfer analog signal processing apparatus for serial-to-parallel conversion, comprising:

a semiconductor substrate of a first conductivity type with an insulating layer disposed thereon;

a plurality of transfer electrodes disposed on said insulating layer for forming a charge transfer channel with a plurality of stages;

transfer pulse supply means for supplying transfer pulses for a given period of time to said transfer electrodes to transfer sampled analog signal charge packets successively from stage to stage;

a plurality of sets of electrodes each set of which is disposed on said insulating layer corresponding to said each stage of said charge transfer channel, and includes a shift electrode disposed adjacent to said corresponding stage, a first storage electrode disposed adjacent to said shift electrode and forming a first storage region in said substrate, a reference electrode disposed adjacent to said first storage electrode and forming a potential barrier in said substrate in response to the application of a substantially constant potential, a second storage electrode disposed adjacent to said reference electrode and forming a second storage region in said substrate, and a reset electrode disposed adjacent to said first storage electrode;

a plurality of first regions formed in said substrate each overlapping with said corresponding first storage electrode and reset electrode and of conductivity type opposite to that of said substrate;

a plurality of second regions formed in said substrate each overlapping with said corresponding reset electrode and connected with one end of a power source and of a conductivity type which is opposite to that of said substrate;

a plurality of charge read-out means formed in said semiconductor substrate each corresponding to said each stage of said charge transfer channel, each of said charge read-out means including an insulating gate field effect transistor and a resistive impedance means connected in series across the power source, the gate electrode of said field effect transfer being connected to said corresponding first region; and means for supplying control signals to said shift electrode, said first and second storage electrodes, and said reset electrode to shift the signal charge packet from the corresponding stage to said first storage region thereby to store the signal charge packets in said first storage region, said first storage region then storing an amount of charge which subsequently increases with time due to dark current charge, and, after a predetermined period of time, transfer only an amount of charge equal to the signal charge packet from said first storage region to said second storage region through the potential barrier under said reference electrode, and exhaust the dark current charge remaining in said first storage region to said second region and transfer the signal charge packet then stored in said second storage region to said first storage region.

3. An analog signal processing apparatus according to claim 2, further comprising:

means formed in said semiconductor substrate for detecting the amount of dark current charge generated during the signal charge storage period of said first storage regions; and means for controlling the potential given to said reference electrode in response to said detecting means.

4. An analog signal processing apparatus according to claim 2, in which the surface potential $\psi REF$ of the semiconductor substrate under said reference electrode and the surface potential $\psi_{S1}$ of the semiconductor substrate under the first storage electrode when the signal charge component is transferred from said first storage region to said second storage region are related by the following equation $$\psi REF - \psi_{S1} = Q_D/C_{S1}$$

where $Q_D$ indicates the amount of dark current charge generated in said first storage region during the storage period and $C_{S1}$ a capacitance under said first storage electrode.

* * * * *